United States Patent [19]
Braun

[11] 4,155,105
[45] May 15, 1979

[54] WRITE CLOCK SIGNAL GENERATOR FOR USE WITH ROTATING MAGNETIC MEMORY SYSTEMS

[75] Inventor: William A. Braun, Acton, Mass.
[73] Assignee: Data General Corporation, Westboro, Mass.
[21] Appl. No.: 828,508
[22] Filed: Aug. 29, 1977
[51] Int. Cl.² ............................................... G11B 5/09
[52] U.S. Cl. ..................................................... 360/51
[58] Field of Search .................................... 360/51, 39

[56] References Cited
U.S. PATENT DOCUMENTS

| | | | |
|---|---|---|---|
| 3,696,353 | 10/1972 | Quioque | 360/51 |
| 3,828,271 | 8/1974 | Schwanauer | 360/51 |
| 3,865,981 | 2/1975 | Welsh et al. | 360/51 |
| 3,898,580 | 8/1975 | Millsap | 360/51 |
| 4,037,257 | 7/1977 | Chari | 360/51 |

*Primary Examiner*—Vincent P. Canney
*Attorney, Agent, or Firm*—Robert F. O'Connell

[57] ABSTRACT

A system for generating a write clock signal for use with a rotating magnetic memory apparatus, such as a disk memory, in a data processing system which includes a slotted disk transducer which produces an intermediate pulse signal having a repetition rate related to the disk speed, a freqency-locked loop which produces a write clock pulse output signal having a repetition rate related to the intermediate repetition rate independently of variations in the disk speed. The time response of the loop can be relatively low to lock the write clock output signal frequency to relatively slow variations in the intermediate frequency and to avoid locking to any extraneous high frequency variations therein. A coded slot region provides a coded pulse sequence, having selected pulses missing therefrom which can be decoded for providing an index pulse, the missing pulses being supplied to the pulses from the transducer to form the intermediate pulse signal. A sector identifying pulse signal can also be obtained from the intermediate pulse signal.

14 Claims, 5 Drawing Figures

WRITE CLOCK SIGNAL GENERATOR FOR USE WITH ROTATING MAGNETIC MEMORY SYSTEMS

INTRODUCTION

This system relates generally to rotating magnetic memory, or disk memory, systems and, more particularly, to a technique for generating a write clock signal for use therein.

BACKGROUND OF THE INVENTION

In disk memory systems for use in data processing apparatus, it is usually desirable to provide a write clock signal from an oscillator which is synchronized with the rotational speed of the data storage disk used therein. In some prior art systems in which the clock signal is not so synchronized, variations in the disk rotational speed require that sufficient space be available on the sector regions of a disk to accommodate all of the data which is to be stored therein when the disk speed is at a maximum. Consequently when the rotational speed is below its maximum, a portion of each sector region is left unused and is wasted. Such speed variations may arise because of changes in either the amplitude or the frequency of the line voltage which is utilized as the power source for the disk drive motor.

In order to make use of the entire region of each sector of a data disk and, thus, avoid wasted disk storage area, other prior art systems have been designed to provide for a precisely controlled disk spindle speed. Such designs, for example, may use synchronous motors or non-synchronous motors having relatively elaborate electro-mechanical servo systems to bring about the required precision control. Such solutions are often too costly for most data processing systems.

Accordingly, in order to avoid the presence of wasted storage area or of costly spindle speed control systems, other prior art systems have provided means for generating write clock signals which are synchronized to the rotational speed of the disk so that variations in the rotational speed will be, in effect, tracked by the clock signal. Such techniques normally require the use of pre-recorded information on a portion of the disk storage pack. This information may often be in the form of available data by which the radial position of a read/write head can be determined. In some cases such data is already present for use in the servo system which provides for correct radial head positioning. It has been found that such data can often be appropriately used as an input to a synchronizing signal which thereupon produces the desired write clock signal.

Other techniques for using pre-recorded information involve the use of a pre-recorded clock track on a separate disk which is dedicated solely to the provision of timing information. Such clock track requires an additional read channel and an additional clock read head which adds to the overall cost and complexity of the disk storage system.

In order to avoid the need for pre-recorded data still other systems have used phase-locked loop techniques, as disclosed, for example, in U.S. Pat. No. 3,898,690 issued to A. K. Desai on Aug. 5, 1975. As can be seen therein, an external rotational transducer in the form of a uniformly slotted disk member mounted on the memory disk spindle shaft and a sensor element mounted adjacent thereto is used to provide basic rotational speed and position information. The transducer produces a pulse signal, the frequency (or pulse repetition rate) of which is equal to a fixed, integral multiple of the number of sectors on the magnetic data disks which are mounted on the same spindle shaft. The pulse output signal is supplied to a phase-locked loop which includes a voltage controlled oscillator for producing a pulse signal which is, in turn, an integral multiple of the pulse output signal from the transducer. The phase-locked loop assures that the frequency and phase of the VCO output signal is exactly synchronized with the pulse output signal from the transducer and, hence, is in turn synchronized with the rotational speed of the data disk. In addition, an extra slot is provided on the rotational transducer disk member to provide an index pulse signal for determining a reference peripheral position on the data disk. The system also provides sector timing signals for identifying the sector regions of the data disks.

The Desai system, however, has certain disadvantages which make it undesirable for use in some applications. The phase-locked loop requires an accurate determination of the phase error, i.e., the phase difference between the input signal and the loop feedback signal and then must utilize a difference amplifier and elaborate high-order filtering to assure that the loop responds only to low frequency variations of the disk file rotational speed, to avoid responding to high frequency variation of slot-to-slot time jitter. Such additional components make the system more costly than is desired in many applications.

Further, the Desai system, by using an extra slot for indexing, subjects the system to indexing errors which can arise when an extraneous transient pulse, not synchronized to the uniform slot pulses, occurs at the sensor output. Such a transient pulse is incorrectly interpreted as an index pulse by the Desai system and causes an incorrect indentification of the data disk sectors.

Moreover, while the Desai system provides a system for sectoring the rotating memory, there is no relationship shown among any of the signals involved in the sectoring process and the "write clock" signal used for clocking data onto the disk memory. Such write clock signal must, therefore, be provided by some other means and suitable synchronizing logic employed for providing the desired timing relationship among the write clock signal and the index and sector signals of Desai's sectoring loop configuration.

It is desirable that the overall sectoring and indexing operation be performed in a less costly manner while, at the same time, avoiding any response to "false" indexing information due to random transient pulses which may arise during operation. Further, it is desirable to provide for a write clock signal directly from the phase-locked loop operation so that further time synchronization logic for synchronizing an independently generated write clock signal with the sectoring and indexing signals is not required.

BRIEF SUMMARY OF THE INVENTION

This invention provides a write clock signal which is directly synchronized with the rotational speed of a rotating magnetic memory and is made available from the same circuitry that is used to generate sectoring and indexing signals without the use of pre-recorded data.

In accordance therewith a frequency locked loop is utilized for determining only whether the frequency of a voltage controlled pulse oscillator is locked to the frequency of an input signal, independently of whether the phase remains strictly in lock at all times. Since only the overall frequency is being tracked, as opposed to the phase, of the input signal, the time response of the loop can be made relatively long, as high as one or more seconds, for example. The use of a long time response for the loop inherently assures that the loop does not respond to high frequency variations, or jitter, and, hence, the need for elaborate filtering required for strict phase-locked loop operation is avoided.

Further, indexing is achieved by utilizing a coded sequence of missing slots at a specified location on the periphery of the transducer disk. The system then utilizes an index decoder which responds only to the coded slot sequence to produce an index signal so that any transient pulses which may arise in the system are not mistakenly interpreted as index pulse signals.

The overall system of the invention, therefore, provides sectoring, indexing and write clock signals in a more effective and less costly manner than systems heretofore available to the art.

DESCRIPTION OF THE INVENTION

A particular preferred embodiment of the invention can be described in more detail with the help of the accompanying drawing wherein.

Figure 1:
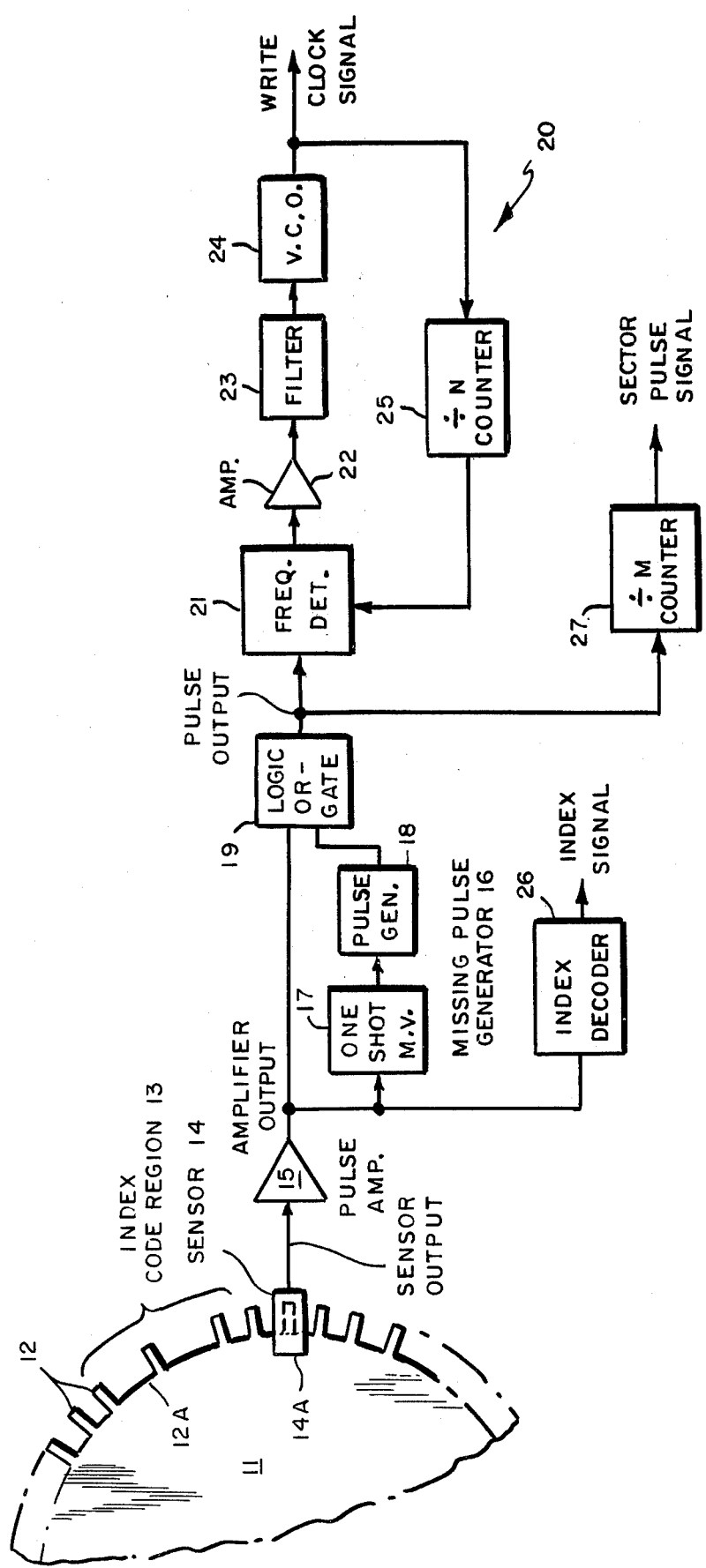
FIG. 1 shows a partial diagrammatic and partial block diagram of one embodiment of the overall system of the invention.

As can be seen in FIG. 1 a rotational transducer 10, mounted on the same shaft as a rotating magnetic memory (not shown), includes a disk 11 having a plurality of projecting teeth 12 formed on its periphery. Such teeth are uniformly spaced around the entire periphery except for a small index code region 13 wherein one or more of the teeth may be missing, the omission thereof representing an appropriate index code. Thus, in a particular example, as described and shown herein, the index code region 13 has a tooth missing on either side of an existing tooth 12A forming, in effect, a code which may be represented in binary fashion as "010," where "0" represents the absence of a tooth and "1" represents the presence of a tooth. An appropriate sensor 14 is mounted adjacent the periphery of disk 11 and in the embodiment shown comprises an appropriate photo emitting element 14A, mounted adjacent one side of the disk, which directs a continuous beam of photons toward a photo responsive element (not shown) mounted directly opposite thereto at the other side of the disk. The teeth on the disk periphery interrupt the optical path between the photo emitting element and the photo responsive element, which interruption operation thereupon provides a pulse train, the frequency, except for the small index code regions, of which corresponds to the rotational speed of the disk 11.

The sensing element need not be optical in form but may utilize other appropriate sensing techniques. For example, the sensor may be in the form of a magnetic pick-up element which produces a pulse each time a disk tooth passes adjacent thereto.

The disk 11 is arranged so that the number of teeth thereon is an integral multiple, M, of the number of sectors, S, on the magnetic data disks associated therewith and mounted on the same spindle shaft. Hence, the pulse train frequency is MS/T where T is the period of revolution of the disk 11. The pulse output signal from sensor 14 is appropriately supplied to a pulse amplifier 15. At the index code region 13 one or more pulses are missing in the pulse signal from sensor 14 and, hence, are missing at the output of amplifier 15, the number of missing pulses depending on the preselected coded tooth pattern at the index code region. In order to provide a signal which can be correctly synchronized to the disk speed at all times, the missing pulses are supplied before the amplifier output is utilized in a frequency-locked loop 20 which controls the synchronization of a desired write clock signal. A missing pulse generator 16 is utilized for this purpose, the operation of which can be best understood with the help of the waveforms shown in FIG. 2.

Figure 2:
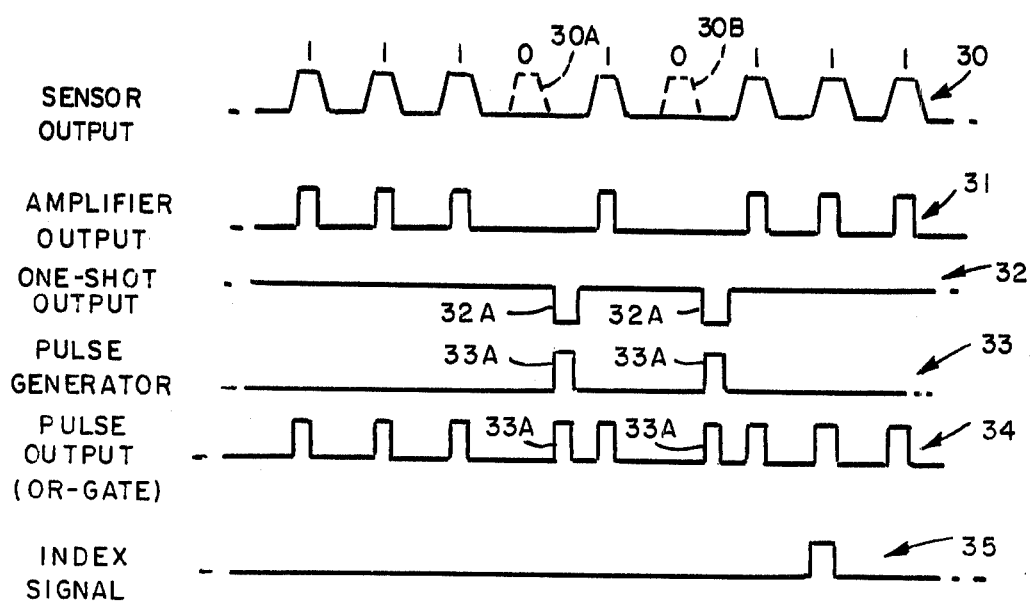
FIG. 2 shows various representative pulse signal waveforms which appear at appropriate points in the system of FIG. 1.

The sensor output in FIG. 2 is depicted by waveform 30 which, at the index code region, has a pulse pattern represented by a "010" code the missing pulses being shown in phantom at positions 30A and 30B. The corresponding output of pulse amplifier 15 is shown as waveform 31. The output from amplifier 15 is supplied to missing pulse generator 16 which includes a one-shot multivibrator 17 which provides an output pulse having a selected duration which is greater than the period between the pulses of waveform 31 but less than the duration of two such periods. Accordingly, the output of multivibrator 17 effectively provides a substantially constant output signal so long as no pulses are missing in waveform 31. When a pulse is absent in waveform 31 the multivibrator output falls to zero at the end of the pulse which has been generated by the pulse immediately preceding the missing pulse. At the next succeeding pulse in waveform 31, the multivibrator again produces its normal output pulses until the next missing pulse. Accordingly, the output of multivibrator 17 at and near the index code region is depicted by waveform 32. The falling edge 32A of a pulse which is generated just prior to a missing pulse is thereupon used to trigger a pulse generator 18, which may be, for example, a second one-shot multivibrator, which produces a pulse having a selected duration about the same as the pulses in waveform 31, as depicted by pulses 33A of waveform 33.

The outputs of amplifier 15 and pulse generator 18 are supplied to a logic circuit 19 which provides an OR-gate function, the output of which is depicted by waveform 34 which includes the pulses of waveform 31 and the pulses 33A produced by pulse generator 18. The pulse repetition rate of waveform 34 is, therefore, MS/T although the pulses generated by missing pulse generator 16 are displaced from the normal periodic pulse position. Because a frequency detector is used, the effect of having the missing pulses re-inserted with a phase error is minimized. Similarly, phase errors due to mechanical tolerance of the slotted disk are minimized.

The pulse signal 34 is thereupon supplied to frequency-locked loop 20 which includes a circuit 21 which is supplied with the pulse output signal from logic circuit 19 and a feedback signal as described below. Detector 21 produces an output signal when the frequencies of the inputs thereto do not coincide, such output signal being amplified and filtered by amplifier 22 and filter 23 and supplied as an input control signal to a voltage controlled oscillator 24. The frequency or pulse repetition rate of the signal from voltage controlled oscillator 24 is nominally at a value NMS/T where N is an integer selected to provide an appropriate clock signal frequency as desired. Since detector 21 is not required to respond to phase differences between the input signals thereto, the presence of displaced pulses 33A in the signal from gate 19 does not affect the frequency detection characteristics thereof, since detector 21 merely compares frequencies, i.e., the number of pulses per unit time. Such pulse count comparisons are made independently of the relative positions of the pulses involved.

The output of voltage controlled oscillator 24 is supplied to a feedback divide-by-N counter 25 the output of which is supplied as the second input to frequency detector 21 for comparison with the first input pulse signal from logic circuit 19. The operation of the frequency-locked loop 20 changes the frequency of the voltage controlled oscillator signal until it is synchronized with the average frequency of the signal from logic circuit 19 which represents the spindle shaft rotational speed. Accordingly, the write clock signal is appropriately synchronized with such rotational speed. Since only a frequency locking operation is required the time responsive of the loop can be made relatively long so that the loop does not respond to high frequency, or jitter, components which may be present on the input signal thereto. In contrast, when conventional phase locked techniques are used, a very slow loop suffers from a limited lock and capture range so that the original capture process can be very difficult. This phenomenon limits the amount of filtering which can be used or adds the complexity of a dual speed loop.

In addition, the system of FIG. 1 permits the identification of an index, or reference, position of the data disks as identified by the index code region 13 of the slotted disk 11. The index code pulse pattern which in the example shown is equivalent to a "010" binary coded signal can be appropriately decoded by a suitable index decoder 26 to produce an index signal 35, identifying the presence of the index code region, as depicted in FIG. 2.

Further, a sector identification pulse signal can be appropriately generated by supplying the pulse output signal from logic circuit 19 to a divide-by-M counter 27. Since the pulse rate of such pulse output signal is equal to MS, division by M at counter 27 produces a sector pulse signal having a pulse rate equal to the number of sectors S on the data disc. Hence, once the index, or reference, position is known each of the sector pulses can identify each of the sectors on the data disks in relation thereto.

In summary, the frequency of the write clock signal from the voltage controlled oscillator 24 is NMS/T, the operation of the frequency-locked loop 20 maintaining such signal in frequency synchronism with the average rotational speed of the slotted disk 11 and, accordingly, the rotational speed of the data storage disks which are mounted on the same rotating spindle shaft.

Figure 5:
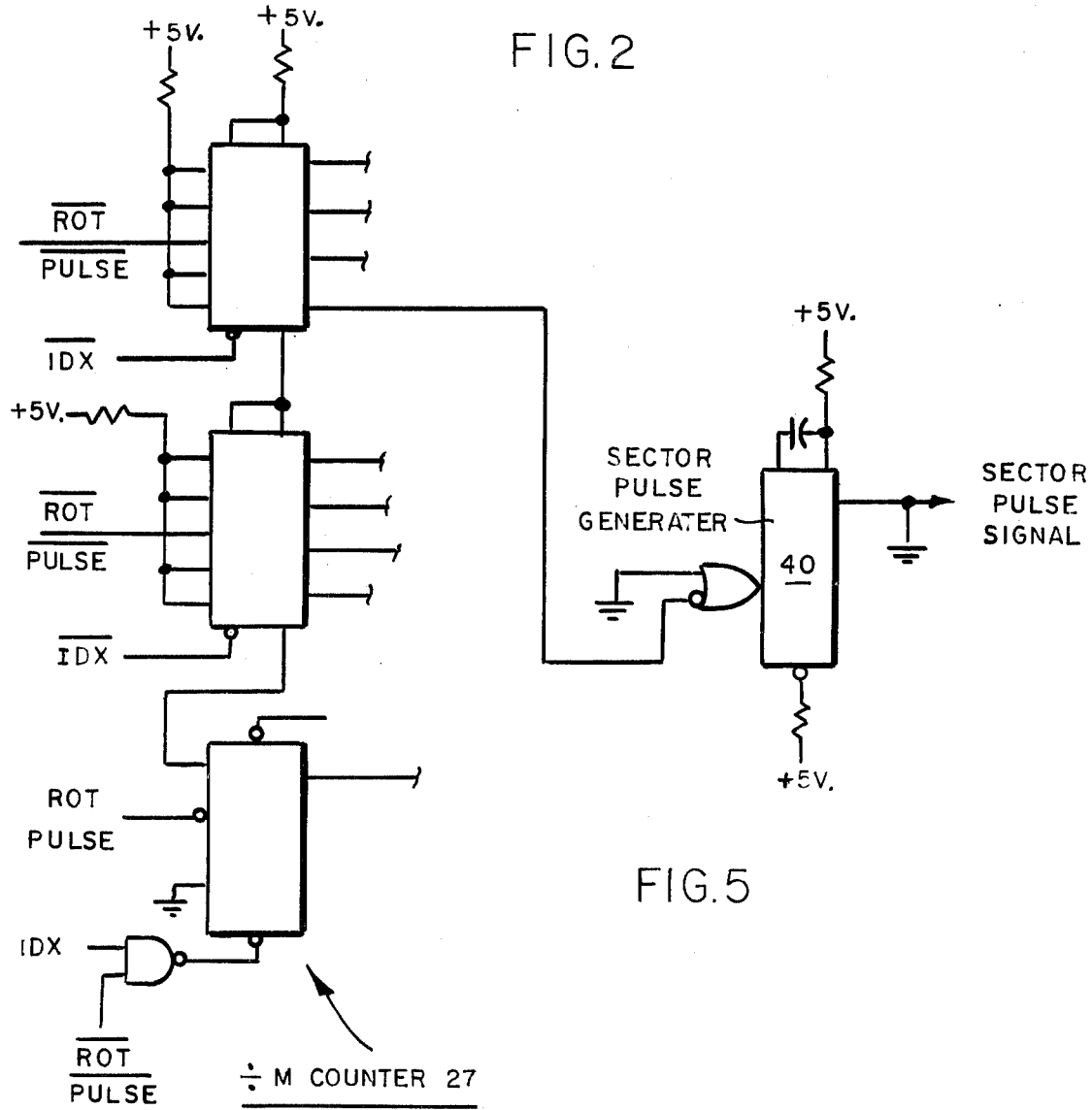
FIGS. 3-5 show specific logic circuitry used in a particular implementation of the system of FIG. 1.
Figure 3:
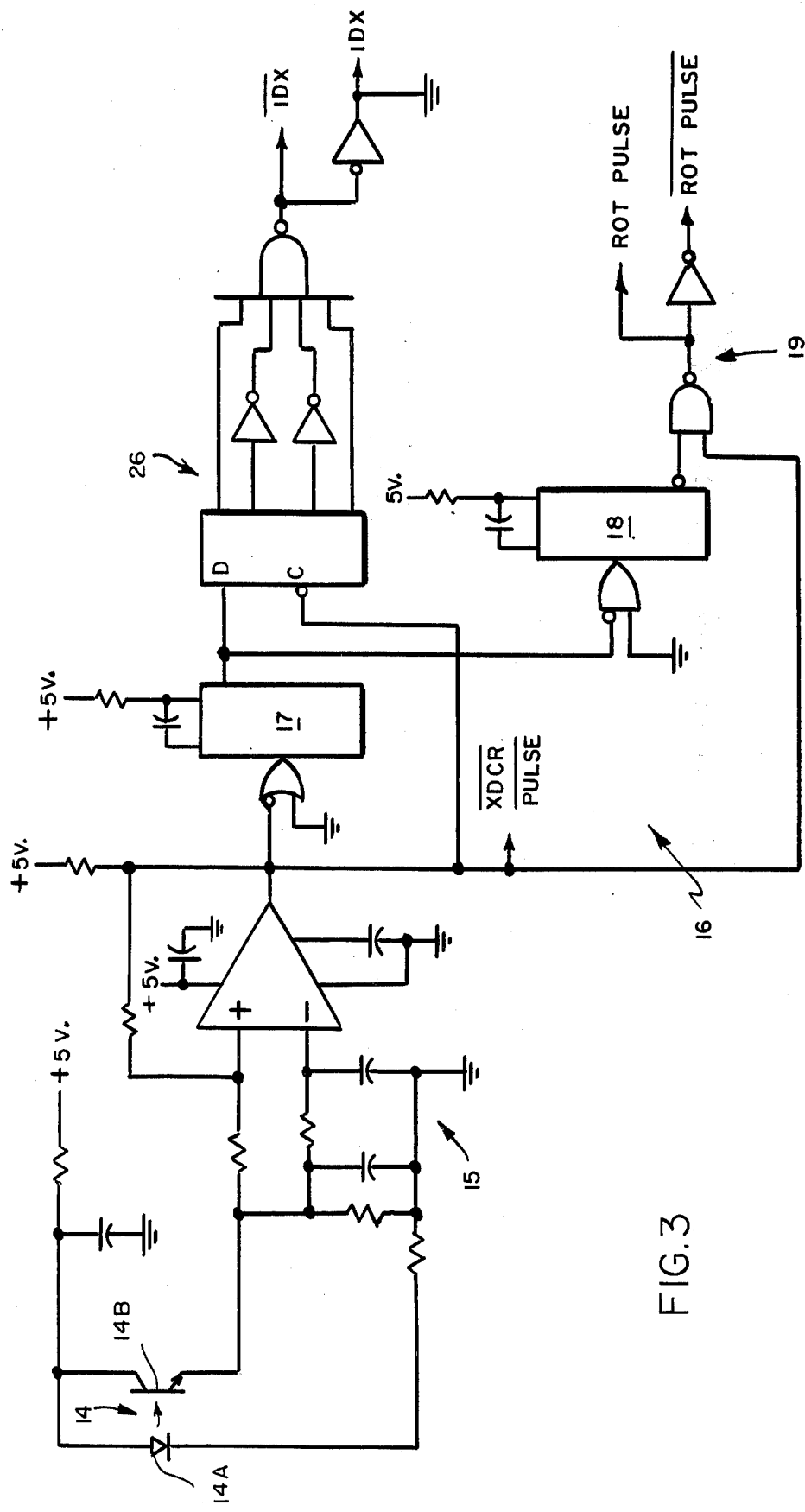
Figure 4:
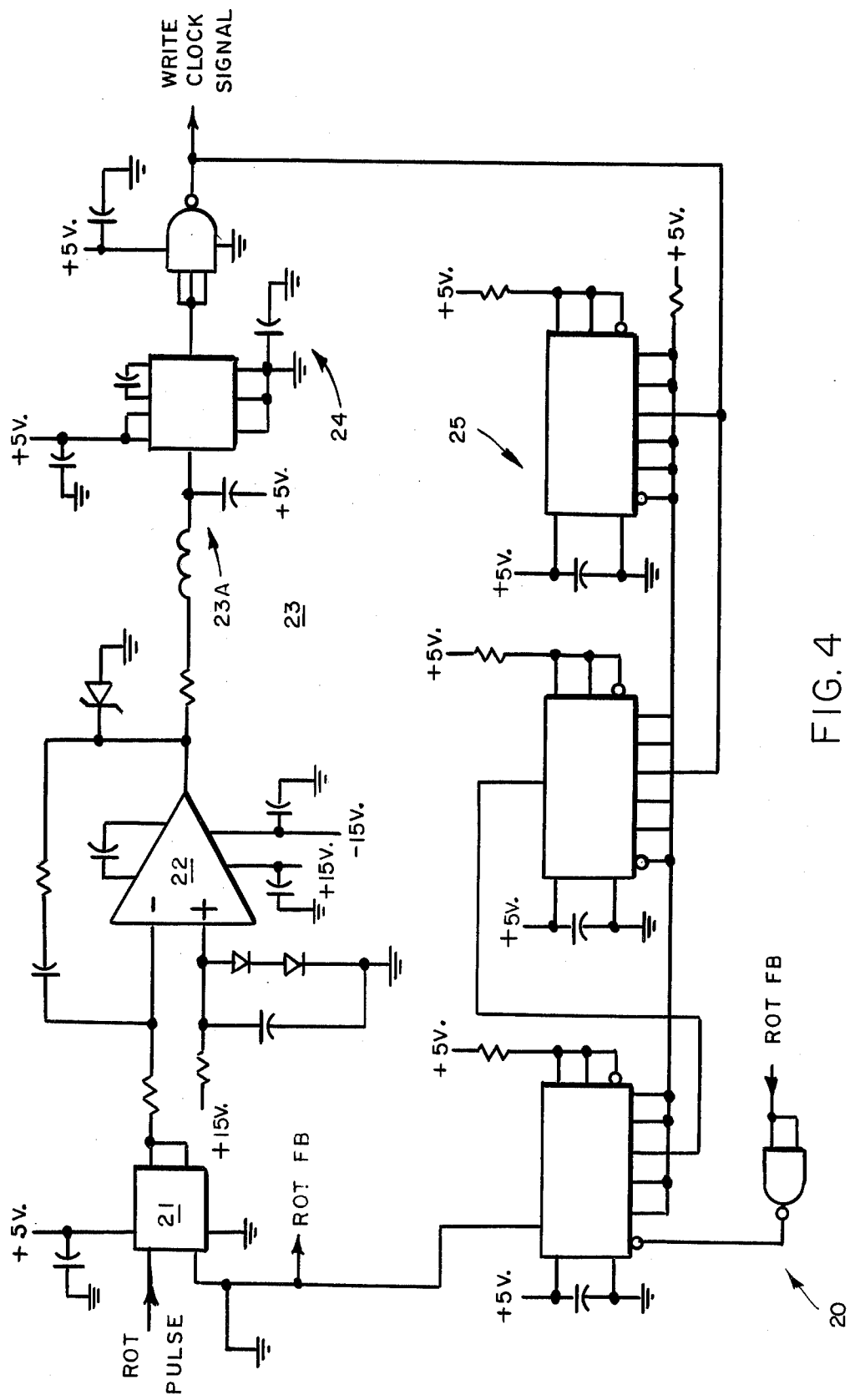

Specific circuitry for implementing the system shown in FIG. 1 is depicted in more detail in FIGS. 3-5. As seen therein, FIG. 3 shows sensor 14, amplifier 15, missing pulse generator 16, logic circuit 19, and index decoder 26. FIG. 4 depicts the frequency-locked loop 20 of the system of FIG. 1, including frequency detector 21, amplifier 22, filter 23, voltage controlled oscillator 24 and divide-by-N counter circuitry 25. The write-clock signal is shown at the output of voltage controlled oscillator 24. FIG. 5 shows the sector pulse signal generator 27 which includes suitable divide-by-M counter circuitry and sector pulse generator circuitry.

As can be seen in FIG. 3, a light emitting element 14A, which may be a suitably selected light-emitting diode, and light responsive element 14B, which may be a suitably selected photo-responsive transistor, produce a plurality of pulses when the optical path therebetween is interrupted by the teeth of slotted disk 11, which pulse signal is thereupon supplied to pulse amplifier circuit 15 which is, for example, an appropriate comparator amplifier readily available to the art. The amplified sensor pulse signal is identified in FIG. 3 as the $\overline{\text{XDCR PULSE}}$ signal and is supplied to logic circuitry 19 which performs an equivalent OR-gate function for producing the pulse output signal identified as the ROT PULSE signal. The output of amplifier 15 is also supplied to one-shot multivibrator 17 of a suitable type readily available to the art to produce a signal of the type depicted by waveform 32 of FIG. 2. The output thereof is in turn supplied to a pulse generator 18 which can be a similar multivibrator circuit having a different pulse length from that of one-shot 17. The pulses which are generated by pulse generator 18 is thereupon supplied as the other input of logic circuit 19, the output thereof supplying a pulse output signal in which the pulse repetition rate is equivalent to that of the sensor pulse signal with the missing pulses being supplied by pulse generator 18 although displaced from the normal periodic positions of the remaining pulses.

The ROT PULSE signal is supplied to frequency detector 21, as depicted in FIG. 4, such circuitry being of the type well known to those in the art for comparing the frequencies of the input signals thereto to produce an output signal when such frequencies do not correspond. One such device is made and sold by Motorola Semiconductor Corporation, Phoenix, Ariz. under the Model designation MC4044.

The output signal from detector 21 in effect is an error signal representing the frequency difference between the input pulse signal from logic circuit 19 and the feedback signal from divide-by-N counter 25. The error signal is thereupon fed to an operational amplifier 22, the output of which is then suitably filtered by filter circuitry 23 essentially comprising inductance-capacitance circuit 23A, as shown. The amplified and filtered signal is supplied as a control signal to a free-running voltage controlled oscillator circuit 24, the latter circuit being of the type generally well known to those in the art. The oscillator produces a pulse signal having a frequency which is nominally set at a value which is an integral multiple of the frequency of the ROT PULSE signal from sensor 14. The VCO output pulse signal is the desired write clock signal, as shown. In order to compare the frequency thereof with that of the signal from sensor 14, the VCO signal frequency must be divided by N as shown by the ÷N counter circuitry 25 which produces a feedback pulse signal identified as the ROT FB signal which is supplied to the other input of detector 21.

Thus, the frequency-locked loop 20 assures that the frequency at the output of the voltage control oscillator 24 is maintained in synchronism with the frequency of the output signal from the sensor 14 and, hence, in synchronism with the rotational speed of the data disks, even should the latter vary.

In order to obtain an index signal, as discussed above, FIG. 3 shows index decoder logic circuitry 26 therefor which is responsive to the pulse signal from amplifier 15 and to the output of one-shot multivibrator 17. The decoder circuit includes a conventional D flip-flop logic element and associated logic circuitry to provide an index signal identified as the IDX signal.

In order to obtain a sector pulse signal, the logic circuitry of FIG. 5 is utilized therefor. As can be seen therein, the ROT PULSE signal (and complementary $\overline{\text{ROT PULSE}}$ signal) and the IDX (and complementary $\overline{\text{IDX}}$ signal) are supplied to a divide-by-M counter circuit 27, one of the output bits therefrom triggering a pulse generator circuit 40, which is also a one-shot multivibrator circuit of the type well known to those in the art and which produces a sector pulse of a selected pulse duration for identifying each of the sectors on the magnetic data disks. The remaining outputs of divide-by-N counter can also be used for other purposes (not shown) in the data processing system which latter purposes are of no concern with respect to the invention described herein.

In summary, the invention provides a write clock signal synchronized to the rotational speed of the spindle shaft without the need for a costly system for precisely controlling the latter speed and without the need for utilizing prerecorded information on any portion of the disk pack or the need for an additional read channel and clock read head. The system does not respond to high frequency, or jitter, variation nor does it respond to spurious transient pulses which might otherwise be misinterpreted as index pulse signals. The overall system of the invention is relatively inexpensive and can be implemented with readily available components so as to provide a compactly packaged system which produces an accurately synchronized write clock signal in the manner described above.

What is claimed is:

1. A system for generating a write clock signal for use with a rotating magnetic memory apparatus comprising sensing means directly responsive to the rotation of said rotating magnetic memory apparatus for generating an intermediate pulse signal, said intermediate pulse signal comprising a plurality of pulses for each revolution of said rotating magnetic memory apparatus, the repetition rate thereof having a selected relationship to the rate of rotation of said rotating magnetic memory apparatus and said sensing means including means for providing an indexing characteristic for identifying the rotational position of said rotating memory apparatus;

frequency-locked loop means responsive to said intermediate pulse signal for producing a pulse output signal for use as a write clock signal, the repetition rate of said pulse output signal having a selected relationship to the repetition rate of said intermediate pulse signal, said frequency-locked loop means having a time response which permits said selected relationship to be maintained independently of variations in the rate of rotation of said rotating magnetic memory apparatus and prevents changes in said selected relationship in response to high frequency variations in said intermediate pulse signal.

2. A system in accordance with claim 1 wherein said frequency means includes electro-mechanical transducer means for producing a first pulse signal, the repetition rate thereof having a selected relationship to the rate of rotation of said rotating magnetic memory apparatus; and electronic means responsive to said first pulse signal for producing said intermediate pulse signal.

3. A system in accordance with claim 2 wherein said electro-mechanical transducer means includes a reference disk member mounted to rotate at the same rate of rotation as said rotating magnetic memory apparatus, said reference disk member having a plurality of periodically spaced indicator means thereon;

a sensor device means mounted adjacent said reference disk member and responsive to said indicator means for producing said first pulse signal, the number of said indicator means being selected so that the repetition rate of said first pulse signal has a predetermined relationship to the rate of rotation of said rotating magnetic memory apparatus.

4. A system in accordance with claim 3 wherein said periodically spaced indicator means are formed as periodically spaced projections on the periphery of said reference disk member; and said sensor device is responsive to the presence of said peripheral projections as they pass adjacent thereto.

5. A system in accordance with claim 4 wherein said sensor means is an optical sensor which produces said first pulse signal when said peripheral projections interrupt the optical path between the optical elements thereof.

6. A system in accordance with claim 3 wherein said indexing characteristic is provided by said reference disk member which has an index region selectively positioned thereon, one or more of said indicator means being omitted at said index region whereby one or more pulses are missing from said first pulse signal, the pattern of said one or more missing pulses being selected to identify the rotational position of said rotating magnetic memory apparatus.

7. A system in accordance with claim 6 wherein said electronic means includes means responsive to said first pulse signal for supplying one or more pulses to replace the one or more missing pulses in said first signal; and means for including said one or more supplied pulses in said first pulse signal to form said intermediate pulse signal.

8. A system in accordance with claim 7 wherein said missing pulse supplying means includes means responsive to said first pulse signal for producing one or more trigger pulses at the positions of said one or more missing pulses therein; and pulse generating means responsive to said one or more trigger pulses for producing one or more replacement pulses; and means for adding said one or more replacement pulses to said first pulse signal to replace the one or more missing pulses therein.

9. A system in accordance with claim 8 wherein said trigger pulse producing means and said pulse generating means are multivibrator means; and said adding means comprises logic circuitry providing an OR-gate function and responsive to said first pulse signal and to the output of said pulse generating means.

10. A system in accordance with claim 7 wherein the pulses supplied to replace the one or more missing pulses in said first pulse signal are slightly displaced from the positions corresponding to those of said missing pulses.

11. A system in accordance with claim 3 wherein the rotating magnetic memory elements of said rotating magnetic memory apparatus include rotating magnetic disk elements each having identifiable sectors thereon and the number of said indicator means on said reference disk member is selected to be an integral multiple M of the number of sectors S on said rotating magnetic disk elements, the repetition rate of said intermediate pulse signal being MS/T, where T is the time period for one revolution of said magnetic disk element.

12. A system in accordance with claim 11 wherein said frequency-locked loop includes a voltage controlled oscillator for producing said pulse output signal, the repetition of said pulse output signal being an integral multiple N of the pulse repetition rate of said intermediate pulse signal whereby said pulse output signal repetition rate is NMS/T.

13. A system in accordance with claim 11 and further including
    means responsive to said intermediate pulse signal for producing a sector pulse signal, the repetition rate thereof corresponding to the number of sectors on said magnetic disk elements.

14. A system in accordance with claim 13 wherein said sector pulse producing means is a divide-by-M counter for dividing the repetition rate of said intermediate pulse signal by M.

* * * * *